US010285301B1

(12) United States Patent
Bailey et al.

(10) Patent No.: US 10,285,301 B1
(45) Date of Patent: May 7, 2019

(54) MULTI-AXIS ALIGNMENT ENCLOSURE SYSTEM FOR WALL-MOUNTED POWER DELIVERY SYSTEM

(71) Applicant: DELL PRODUCTS, L.P., Round Rock, TX (US)

(72) Inventors: Mark M. Bailey, Round Rock, TX (US); Ty R. Schmitt, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/960,434

(22) Filed: Apr. 23, 2018

(51) Int. Cl.
| | | |
|---|---|---|
| *H02G 5/00* | (2006.01) | |
| *H02G 5/08* | (2006.01) | |
| *H05K 7/14* | (2006.01) | |
| *H05K 7/20* | (2006.01) | |
| *H02G 3/08* | (2006.01) | |
| *H02G 3/18* | (2006.01) | |
| *H02G 3/03* | (2006.01) | |

(52) U.S. Cl.
CPC .......... *H05K 7/1497* (2013.01); *H02G 3/083* (2013.01); *H02G 3/088* (2013.01); *H02G 3/18* (2013.01); *H02G 5/002* (2013.01); *H02G 5/007* (2013.01); *H02G 5/08* (2013.01); *H05K 7/1492* (2013.01); *H02G 3/03* (2013.01); *H05K 7/20745* (2013.01)

(58) Field of Classification Search
CPC .... H05K 7/1492; H05K 7/1497; H02G 5/002; H02G 5/007; H02G 5/08
See application file for complete search history.

(56) References Cited

U.S. PATENT DOCUMENTS

| 2,122,298 | A | * | 6/1938 | Scott, Jr. | ................ H02G 5/025 |
| | | | | | 174/129 B |
| 2,879,319 | A | * | 3/1959 | Carlson | .................... H02G 5/06 |
| | | | | | 174/70 B |
| 2,957,968 | A | * | 10/1960 | Matthysse | ................ H01R 4/44 |
| | | | | | 200/507 |
| 3,212,046 | A | * | 10/1965 | Abel | ...................... H01R 35/02 |
| | | | | | 174/34 |

(Continued)

FOREIGN PATENT DOCUMENTS

| DE | 2415949 A1 * | 10/1974 | ............... H01B 5/02 |
| DE | 3502864 A1 * | 7/1986 | ............... H02G 5/02 |

(Continued)

*Primary Examiner* — Robert J Hoffberg
(74) *Attorney, Agent, or Firm* — Isidore PLLC

(57) ABSTRACT

A power busway assembly of a power distribution system in a modular data center (MDC) includes first and second power busways attached respectively to first and second information (IT) modules that are approximately aligned. A cable tap box is attached to the first IT module and receives a first free end of the first power busway in an opening in a first surface. A second surface of the cable tap box has a second busway opening that is sized larger than the second power busway to allow an amount of linear misalignment. An adjustable mounting fixture has a central opening that slidingly engages the second free end of the second power busway. An outer portion of the adjustable mounting fixture adjustably attaches to the second surface of the cable tap box to position the second power busway within the second busway opening, enabling flexible cable connections between busways.

15 Claims, 10 Drawing Sheets

(56) References Cited

U.S. PATENT DOCUMENTS

| | | | |
|---|---|---|---|
| 3,325,588 A * | 6/1967 | Lear | H01R 35/02 |
| | | | 174/32 |
| 3,527,875 A * | 9/1970 | Saxon | H02G 5/002 |
| | | | 174/169 |
| 3,737,558 A * | 6/1973 | Seaquist | H01R 4/60 |
| | | | 174/86 |
| 4,170,190 A | 10/1979 | Warner | |
| 4,204,085 A * | 5/1980 | Chapman | H02B 1/54 |
| | | | 174/13 |
| 5,760,339 A * | 6/1998 | Faulkner | H01R 25/162 |
| | | | 174/88 B |
| 6,042,932 A * | 3/2000 | Ingles | B23K 1/0008 |
| | | | 428/209 |
| 6,948,939 B1 * | 9/2005 | Kogan | H01R 35/04 |
| | | | 174/93 |
| 7,306,489 B2 | 12/2007 | Werthman et al. | |
| 7,704,083 B1 * | 4/2010 | Cheyne | H01R 25/162 |
| | | | 439/115 |
| 7,806,711 B2 * | 10/2010 | Andersen | H01R 13/112 |
| | | | 439/251 |
| 8,007,301 B2 * | 8/2011 | Andersen | H01R 13/112 |
| | | | 439/251 |
| 8,240,485 B2 | 8/2012 | Bushby et al. | |
| 8,576,082 B2 | 11/2013 | Jones | |
| 8,721,368 B2 * | 5/2014 | Zhao | H01M 2/206 |
| | | | 439/350 |
| 8,864,516 B2 * | 10/2014 | Herring | H05K 7/1451 |
| | | | 361/729 |
| 9,033,748 B2 * | 5/2015 | Ramey | H01R 13/621 |
| | | | 439/813 |
| 9,331,442 B2 * | 5/2016 | Binnendijk | H02G 5/007 |
| 9,385,517 B2 | 7/2016 | Baldwin | |
| 9,529,940 B2 | 12/2016 | Shaw et al. | |
| 9,537,291 B1 | 1/2017 | Wilding et al. | |
| 9,590,404 B2 | 3/2017 | Bailey et al. | |
| 9,590,405 B1 | 3/2017 | Maurer et al. | |
| 9,590,406 B1 | 3/2017 | Maurer et al. | |
| 9,631,365 B2 | 4/2017 | Bottin et al. | |
| 9,704,373 B2 | 7/2017 | Borbolla et al. | |
| 9,778,717 B2 | 10/2017 | Kaplan | |
| 9,929,554 B2 * | 3/2018 | Ross | H02G 5/08 |
| 2013/0032310 A1 | 2/2013 | Jaena et al. | |
| 2013/0083476 A1 | 4/2013 | Clidaras et al. | |
| 2015/0380917 A1 | 12/2015 | Ross et al. | |
| 2016/0181748 A1 | 6/2016 | Rathjen et al. | |
| 2016/0372909 A1 | 12/2016 | Baldwin et al. | |
| 2018/0097322 A1 * | 4/2018 | Harris, III | H01R 25/162 |

FOREIGN PATENT DOCUMENTS

| | | | | |
|---|---|---|---|---|
| DE | 19846626 B4 * | 8/2005 | | H02G 5/002 |
| DE | 102011004229 A1 * | 8/2012 | | H02G 5/002 |
| EP | 0143189 A2 * | 6/1985 | | H02G 5/002 |

* cited by examiner

MULTI-AXIS ALIGNMENT ENCLOSURE SYSTEM FOR WALL-MOUNTED POWER DELIVERY SYSTEM

BACKGROUND

1. Technical Field

The present disclosure relates in general to power distribution to an information handling system (IHS), and more particularly to busbar power distribution between enclosures of a modular distribution center (MDC).

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Large-scale IHSs (LIHSs) are often deployed as a modular data center (MDC) comprising different interconnected modular units. Each modular unit is configured at an original equipment manufacturer (OEM) and shipped to a deployed location. With a MDC deployment, IHSs and support infrastructure such as communication networking, power distribution, and cooling systems can be rapidly shipped to an operation destination and connected to power and communication conduits. Information technology (IT) modules contain a row of racked-based IHSs that receive cooling and electrical power. Busways that include three or more power busbars are mounted to an interior wall of each IT module to carry three-phase alternating current (AC) electrical power. These busways are connected to each other at connecting surfaces of adjacent IT modules. To have sufficient power capacity, the power busbars are thick, rigid metal plates and are difficult to connect together at the intersecting surfaces, particularly because each busway is aligned to a respective IT module. Given surface variations at a deployment location of the MDC and the size of each IT module, adjacent IT modules and thus their respective installed busways can be shifted relative to each other.

BRIEF SUMMARY

In accordance with the teachings of the present disclosure, a power busway assembly includes a first power busway comprising one or more power busbars. The first power busway is attachable to a first wall of a first information technology (IT) module of a modular data center (MDC). The first power busway has a first free end. A second power busway has one or more power busbars and has a second free end. The second power busway is attachable to a second wall of a second IT module that is approximately aligned with the first wall of the first IT module. A cable tap box is attachable to the first wall of the first IT module. The cable tap box has a first surface including a first busway opening that receives the first free end of the first power busway. The cable tap box has a second surface with a second busway opening that is sized larger than the second power busway. The cable tap box receives the second free end of the second power busway with an amount of linear misalignment. An adjustable mounting fixture has a central opening that slidingly engages the second free end of the second power busway. The adjustable mounting fixture has an outer portion that adjustably attaches to the second surface of the cable tap box to position the second power busway within the second busway opening, enabling flexible cable connections between first and second busways within the cable tap box.

According to aspects of the present innovation, an MDC includes a first IT module having a first wall. The MDC includes a second IT module, adjacent to the first IT module and having a second wall that is approximately aligned with the first wall of the first IT module. The MDC includes a power busway assembly that includes first and second power busways and a cable tap box. The first power busway has one or more power busbars with a first free end. The first power busway is attached to the first wall of the first IT module. The second power busway has one or more power busbars with a second free end. The second power busway is attached to the second wall of the second IT module. The cable tap box is attached to the first wall of the first IT module and has a first surface including a first busway opening that receives the first free end of the first power busway. The cable tap box has a second surface with a second busway opening that is sized larger than the second power busway. The cable tap box receives the second free end of the second power busway with an amount of linear misalignment. An adjustable mounting fixture has a central opening that slidingly engages the second free end of the second power busway. The adjustable mounting fixture has an outer portion that adjustably attaches to the second surface of the cable tap box to position the second power busway within the second busway opening, enabling flexible cable connections between first and second busways within the cable tap box.

According to illustrative embodiments of the present disclosure, a method is provided for power distribution between IT modules using busbars. The method includes approximately aligning a first wall of a first IT module with a second wall of an adjacent second IT module of a MDC. A first power busway comprising one or more power busbars is attached to the first wall of the first IT enclosure. A first free end of the first power busway is inserted into a first busway opening on a first surface of a cable tap box. The cable tap box is attached to the first wall of the first IT module. The method includes inserting a second free end of a second power busway through a central opening in an adjustable mounting fixture and into a second busway opening of a second surface of the cable tap box. The second power busway that is attached to the second wall of the second IT module. The second busway opening is sized larger than the second power busway to receive the second free end of the second power busway with an amount of linear misalignment. The method includes attaching the adjustable mounting fixture to the second surface of the cable tap box to secure the second power busway in the second busway opening, enabling flexible cable connections between first and second busways within the cable tap box.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

According to aspects of the present innovation, a power busway assembly, modular data center (MDC) and method provide for power distribution between two information technology (IT) modules. The power busway assembly of the power distribution system includes first and second power busways attached respectively to first and second IT modules that are approximately aligned. A cable tap box is attached to the first IT module and receives a first free end of the first power busway in an opening in a first surface. A second surface of the cable tap box has a second busway opening that is sized larger than the second power busway to allow an amount of linear misalignment. An adjustable mounting fixture has a central opening that slidingly engages a second free end of the second power busway. An outer portion of the adjustable mounting fixture adjustably attaches to the second surface of the cable tap box to position the second power busway within the second busway opening, enabling flexible cable connections between first and second busways within the cable tap box.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
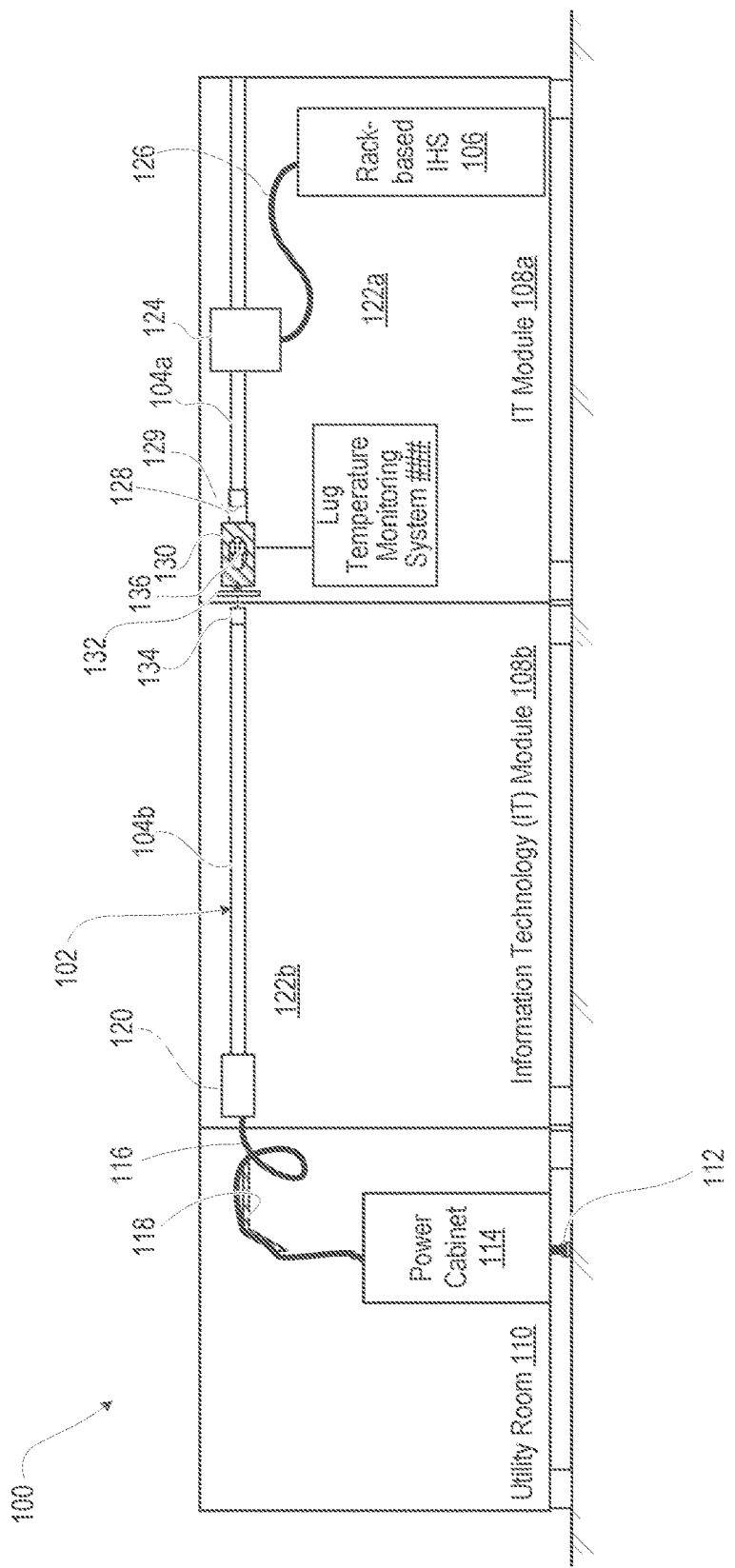
FIG. 1 is a side view of a modular data center (MDC) having a busway power distribution system to a rack-based information handling system (IHS), according to one or more embodiments.

FIG. 1 is a side view of MDC 100 having power distribution system 102 that delivers electrical power via busways 104a-104b to rack-based IHS 106 of IT modules 108a-108b. Utility room 110 is positioned above substrate-installed power conduit 112 that provides power to power cabinet 114. High-capacity power cable 116 supported by cable bracket 118 terminates into first cable tap box 120. First cable tap box 120 facilitates the electrical connection of high-capacity power cable 116 to second busway 104b mounted on second wall 122b of second IT module 108b. First busway 104a is mounted on first wall 122a of first IT module 108a. Bus plug 124 provides a fused connection of power from first busway 104a via power whip or cord 126 to rack-based IHS 106.

Utility room 110 contains structures and equipment that functionally support MDC 100, including communication network connections and power distribution connections within MDC 100 and/or to sources outside of MDC 100. In the presented embodiment, MDC 100 is and/or is configured as an Expandable Modular Information Technology Building Infrastructure (EMITBI). Further, because of the relatively large scale of MDC 100 and the use of modular building blocks that provides IT modules 108a-108b and utility room 110 are collectively referred to herein as a modularly-constructed, large-scale information handling system (LIES). Within the general context of IHSs, rack-based IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communication between the various hardware components.

Returning to FIG. 1, to connect first busway 104a to second busway 104b, sleeve 128 of adjustable cable tap box 130 is slid onto first free end 129 of first busway 104a. Adjustable cable tap box 130 has adjustable mounting fixture 132 that connects to second free end 134 of second busway 104b. When mounted to respective first and second walls 122a-122b of first and second IT modules 108a-108b, relative misalignments in mounting of power busways 104a-104b or positioning of IT modules 108a-108b can create linear misalignment of second busway 104b to adjustable cable tap box 130. Adjustable mounting fixture 132 allows physical and electrical attachment between adjacent busways 104a-104b having one or more of: (i) horizontal; (ii) vertical; and (iii) rotation misalignment. Longitudinal misalignment is also compensated for by allowing second busway 104b to extend into adjustable cable tap box 130 to a varying degree.

Figure 2:
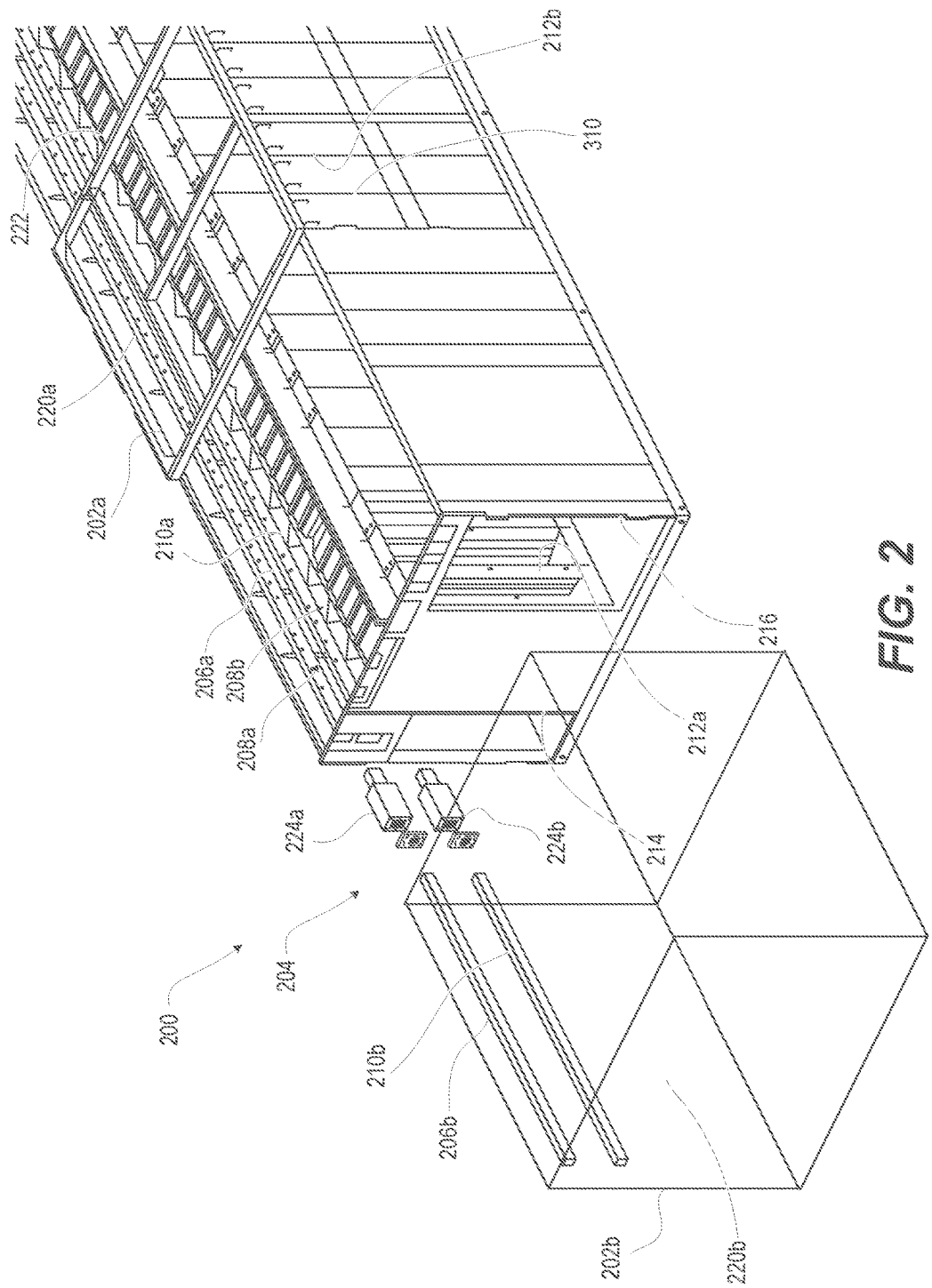
FIG. 2 is an isometric, disassembled view of an example MDC having two information technology (IT) modules electrically connectable by a busway power distribution system, according to one or more embodiments.

FIG. 2 is an isometric, disassembled view of example MDC 200 having two IT module enclosures 202a-202b electrically connected by power distribution system 204. Power distribution system 204 includes first and second busways 206a-206b of upper busway subsystem 208a and first and second busways 210a-210b of lower busway subsystem 208b. In one or more embodiments, upper busway subsystem 208a including busways 206a-206b, bus plugs, cords, etc. are of a first color such as red. Lower busway subsystem 208b including busways 210a-210b, bus plugs, cords, etc. are of a second color such as blue. During setup, MDC 200 has open slots 212a in IT module enclosure 202a for receiving rack-based IHS(s) 106 (FIG. 1) placed in a row between hot aisle 214 and cold aisle 216. Doors 218 provide an air seal for other closed slots 212b to force cooling air through open slots 212a. Power distribution system 204 is installed on back walls 220a-220b adjacent to hot aisle 214. Cords 126 (FIG. 1) are routed above hot aisle 214 and carried on cable bracket 222. As rack-based IHSs are installed, bus plugs and cords can be added to provide additional power distribution. Upper and lower adjustable cable tap boxes 224a-224b provide physical and electrical attachment capabilities to connect respectively upper and lower busway subsystems 208a-208b between adjacent IT module enclosures 202a-202b.

Figure 3:
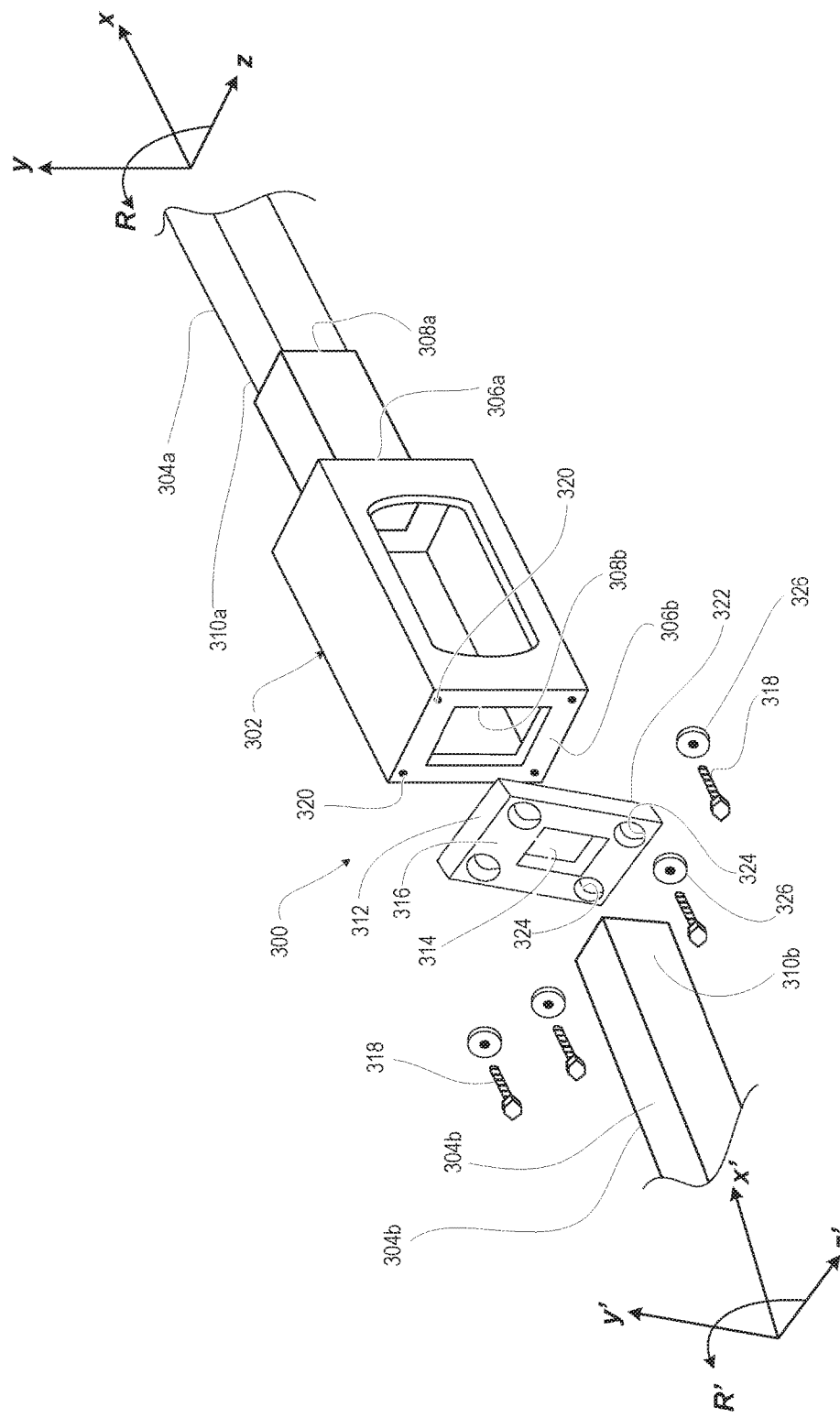
FIG. 3 is an isometric, disassembled view of an adjustable cable tap box that connects two misaligned busways, according to one or more embodiments.

FIG. 3 is an isometric, disassembled view of power distribution system 300 with adjustable cable tap box 302 that connects first power busway 304a to second power busway 304b, which is misaligned relative to first power busway 304a and/or a center of busway opening of cable tap box 302. In one or more embodiments, cable tap box 302 has first surface 306a including first busway opening 308a that receives first free end 310a of first power busway 304a. Cable tap box 302 has second surface 306b with second busway opening 308b that is sized larger than second power busway 304b to receive second free end 310b of second power busway 304b with an amount of linear misalignment. Adjustable mounting fixture 312 of cable tap box 302 has central opening 314 that slidingly engages second free end 310b of second power busway 304b. Adjustable mounting fixture 312 has outer portion 316 that adjustably attaches to second surface 306b of cable tap box 302 to position second power busway 304b within second busway opening 308b. In one or more embodiments, adjustable mounting fixture 312 includes two or more headed fasteners 318 that are received in threaded fastener holes 320 in second surface 306b of cable tap box 302. Adjustable mounting fixture 312 includes adjustment plate 322 having more than one fastener through hole 324 that are elongate to provide at least one of: (i) horizontal, (ii) vertical and (iii) rotational adjustment between second surface 306b of cable tap box 302 and adjustment plate 322. Oversize washers 326 engage headed fasteners 318 adjustably positioned within elongate fastener through holes 324.

Figure 4:
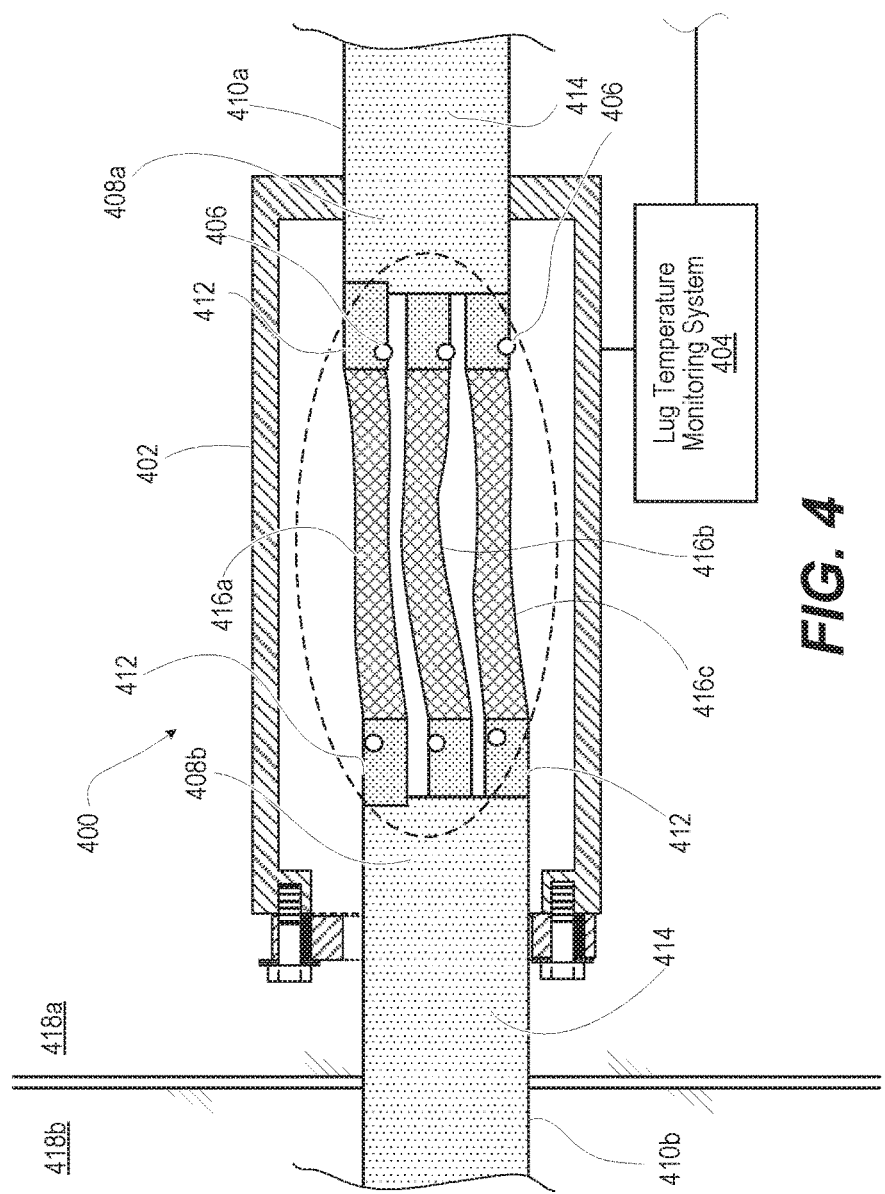
FIG. 4 is a side cross-sectional view of the adjustable cable tap box with a temperature thermocouple based lug temperature monitoring system, according to one or more embodiments.

FIG. 4 is a side cross-sectional view of power distribution system 400 including adjustable cable tap box 402 with lug temperature monitoring system 404 based on temperature thermocouples 406. Free ends 408a-408b respectively of first and second power busways 410a-410b present cable lugs 412 extending from and electrically connected to each end of three or four power busbars 414. Flexible power cables 416a-416c are contained within cable tap box 402. Flexible power cables 416a-416c are attached between respective cable lugs 412 of first and second power busways 410a-410b to provide electrical power connectivity between first and second IT modules 418a-418b. Power busways 410a-410b carry high levels of electrical power. Electrical connections between power busways 410a-410b within adjustable cable tap box 402 need to have a corresponding capacity as well as low resistance connectors. Improperly installed or degraded electrical connections within adjustable cable tap box 402 create electrical resistance, and thus heat generation. Such connections include cable lugs 412 that enable connections between first and second power busways 410a-410b. Lug temperature monitoring system 404 is either an autonomous system or integrated with IHS 106 (FIG. 1) to create a maintenance alert when an abnormally high temperature is sensed in adjustable cable tap box 402.

Figure 5:
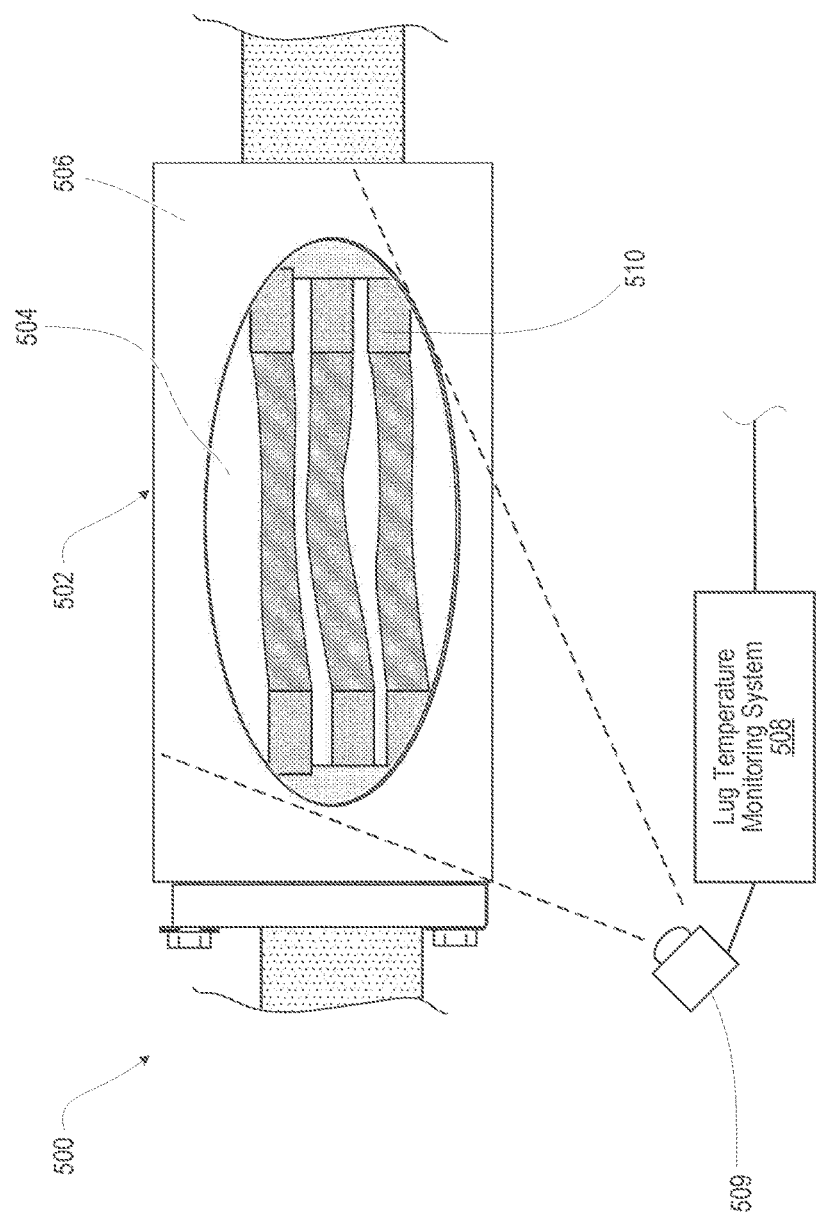
FIG. 5 is a side view of the adjustable cable tap box with an infrared lug temperature monitoring system, according to one or more embodiments.

FIG. 5 is a side view of a power distribution system 500 that includes adjustable cable tap box 502 with infrared (IR) window 504 in front plate 506. IR window 504 enables IR lug temperature monitoring system 508 to scan (using IR sensor 509) for temperatures that indicate a need for maintenance. Cable lugs 510 that exhibit high temperatures require maintenance to prevent failure.

Figure 6:
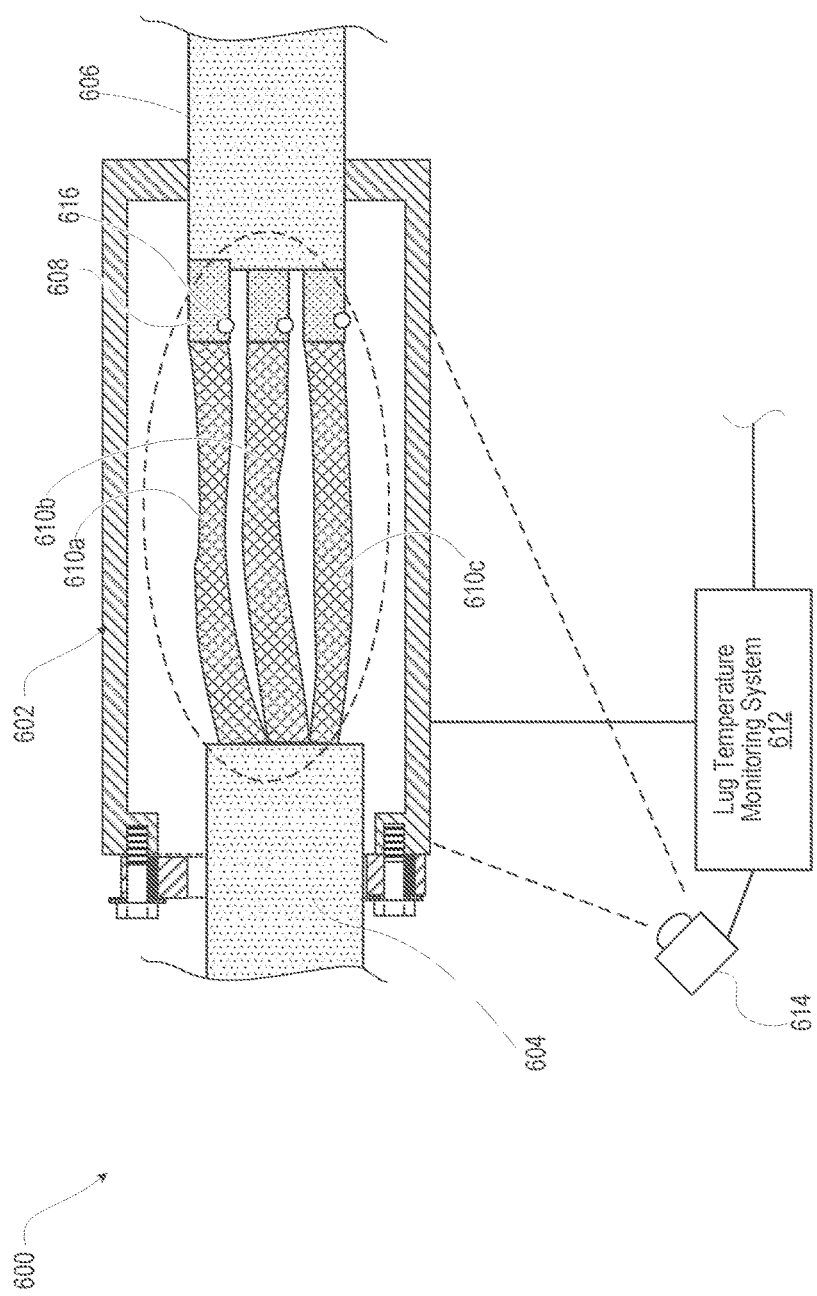
FIG. 6 is a side view of the adjustable cable tap box connecting a power cable to a busway with a lug temperature monitoring system based on both infrared and temperature thermocouple sensing, according to one or more embodiments.

FIG. 6 is a side view of a power distribution system 600 that includes adjustable cable tap box 602 connecting a high-capacity power cable 604 to a busway 606 having cable lugs 608. Flexible power cables 610*a*-610*c* of high-capacity power cable 604 carry one phase of three-phase AC power and are respectively attached to cable lugs 608. Lug temperature monitoring system 612 includes both IR sensor 614 and connection to temperature thermocouple 616 to detect abnormal heating of cable lugs 608.

Figure 7:
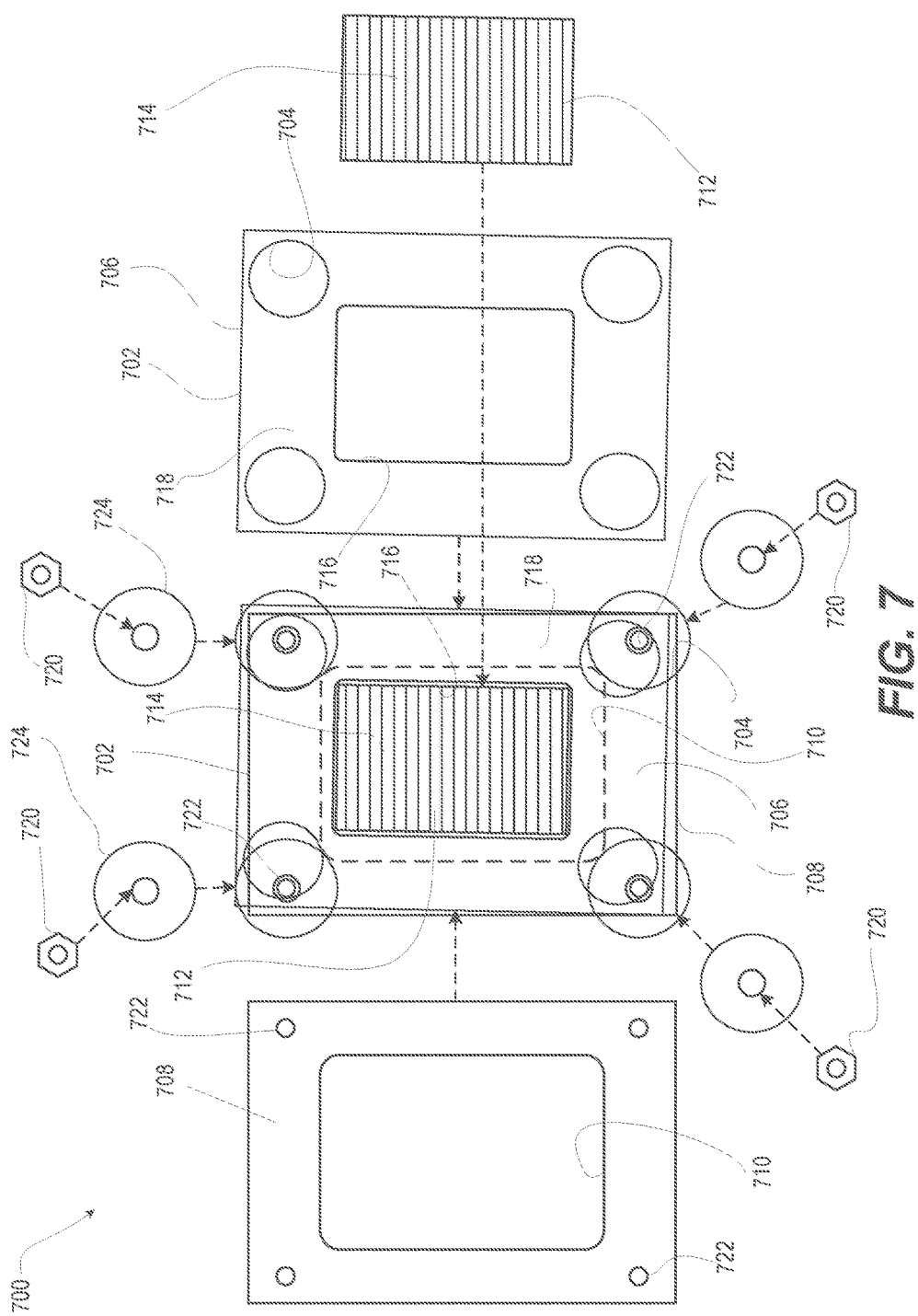
FIG. 7 is an end disassembled view of the cable tap box and an example adjustable mounting fixture having elongate bolt through holes, according to one or more embodiments.

FIG. 7 is an end disassembled view of cable tap box 700 comprising example adjustable mounting fixture 702. Elongate bolt through holes 704 are formed in an adjustment plate 706 of adjustable mounting fixture 702. Cable tap box 700 has second surface 708 having second busway opening 710 sized larger than second power busway 712. Second busway opening 710 receives second free end 714 of second power busway 712 with an amount of linear misalignment. Adjustable mounting fixture 702 of cable tap box 700 has central opening 716 that slidingly engages second free end 714 of second power busway 712. Adjustable mounting fixture 702 has outer portion 718 that adjustably attaches to second surface 708 of cable tap box 700 to position second power busway 712 within second busway opening 710. In one or more embodiments, adjustable mounting fixture 702 includes two or more headed fasteners 720 that are received in threaded fastener holes 722 in second surface 708 of cable tap box 700. Adjustable mounting fixture 702 includes adjustment plate 706 having more than one fastener through hole 704 that are elongate to provide at least one of: (i) horizontal, (ii) vertical and (iii) rotational adjustment between second surface 708 of cable tap box 700 and adjustment plate 706. Oversize washers 724 engage headed fasteners 720 adjustably positioned within elongate fastener through holes 704.

Figure 8:
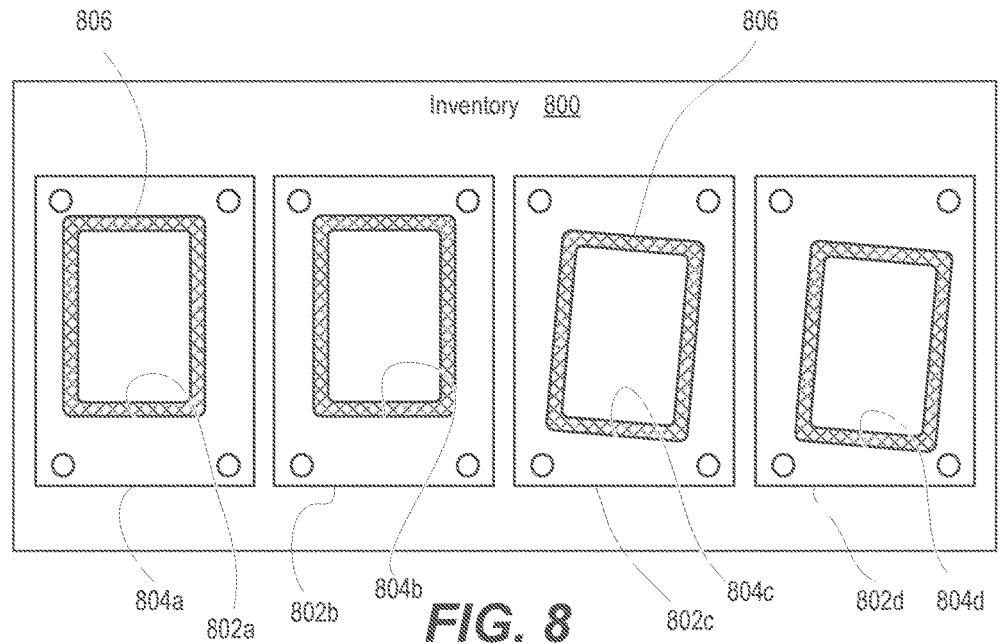
FIG. 8 is an example inventory of adjustable mounting fixtures having resiliently lined openings in various position, according to one or more embodiments.

FIG. 8 is example inventory 800 of adjustable mounting fixtures 802*a*-802*d* having second busway openings 804*a*-804*d* that are lined with a resilient material 806 to accommodate additional misalignment. Second busway openings 804*a*-804*d* are varied in orientation respectively: (i) non-rotated, top, left position; (ii) non-rotated, top, centered position; (iii) clockwise rotated, centered, middle position; and (iv) clockwise rotated bottom, left position. By flipping each of adjustable mounting fixtures 802*a*-802*d* top to bottom and/or back to front additional displacement and orientations of second busway openings 804*a*-804*d* are created.

Figure 9:
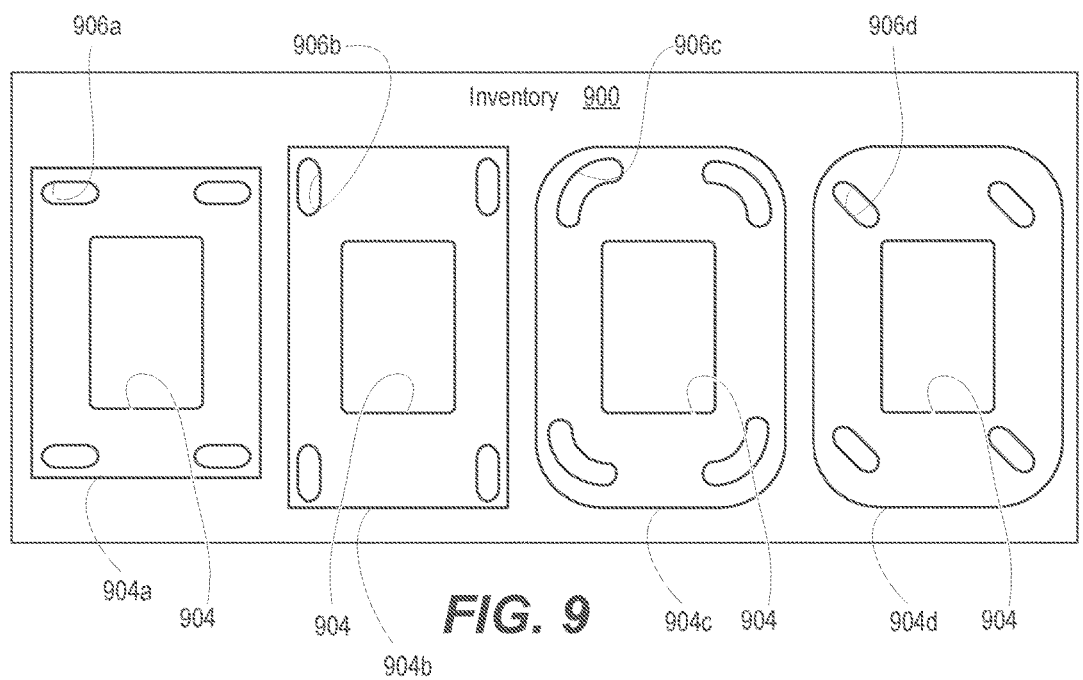
FIG. 9 is an example inventory of adjustable mounting fixtures having differently oriented sets of elongate bolt through holes, according to one or more embodiments.

FIG. 9 is example inventory 900 of adjustable mounting fixtures 902*a*-902*d* each with a centered and non-rotated second busway openings 904 with differently oriented sets of elongate bolt through holes 906*a*-906*d*: (i) horizontally adjustable; (ii) vertically adjustable; (ii) rotationally adjustable; and (iv) diagonally adjustable. The latter can be flipped front to back to translate in an opposite diagonal direction.

Figure 10:
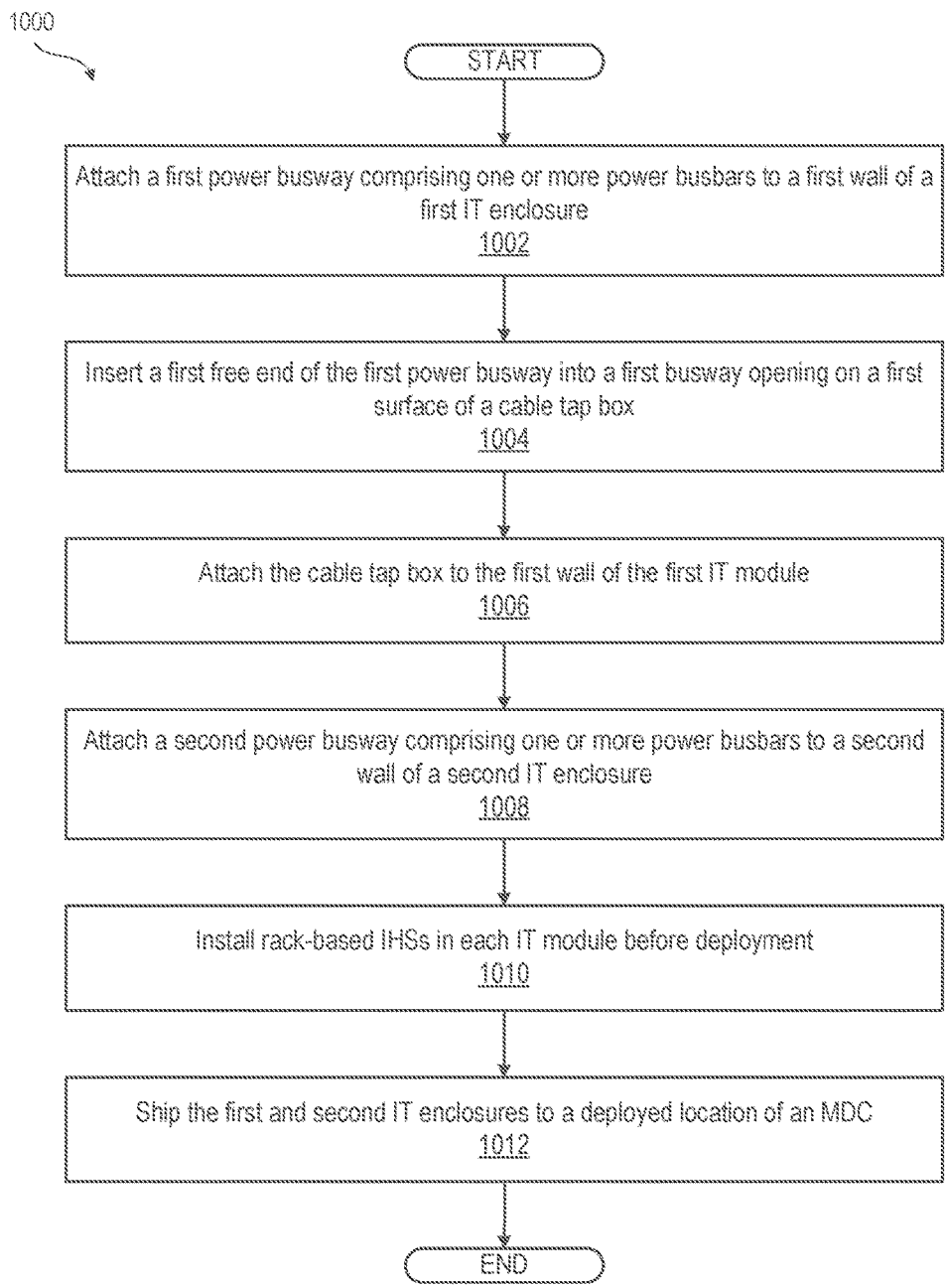
FIG. 10 is a flow diagram of a method of assembling a portion of a busway power distribution system in IT modules at an original equipment manufacturer (OEM) before deployment, according to one or more embodiments, according to one or more embodiments.

FIG. 10 is a flow diagram of a method 1000 of assembling a portion of a busway power distribution system in IT modules at an original equipment manufacturer (OEM) before deployment. Method 1000 begins attaching a first power busway comprising one or more power busbars to a first wall of a first IT enclosure (block 1002). Method 1000 includes inserting a first free end of the first power busway into a first busway opening on a first surface of a cable tap box (block 1004). Method 1000 includes attaching the cable tap box to the first wall of the first IT module (block 1006). Method 1000 includes attaching a second power busway comprising one or more power busbars to a second wall of a second IT enclosure (block 1008). In one or more embodiment, Method 1000 includes installing rack-based IHSs in each IT module before deployment (block 1010). Method 1000 includes shipping the first and second IT enclosures to a deployed location of an MDC (block 1012). Then method 1000 ends.

Figure 11:
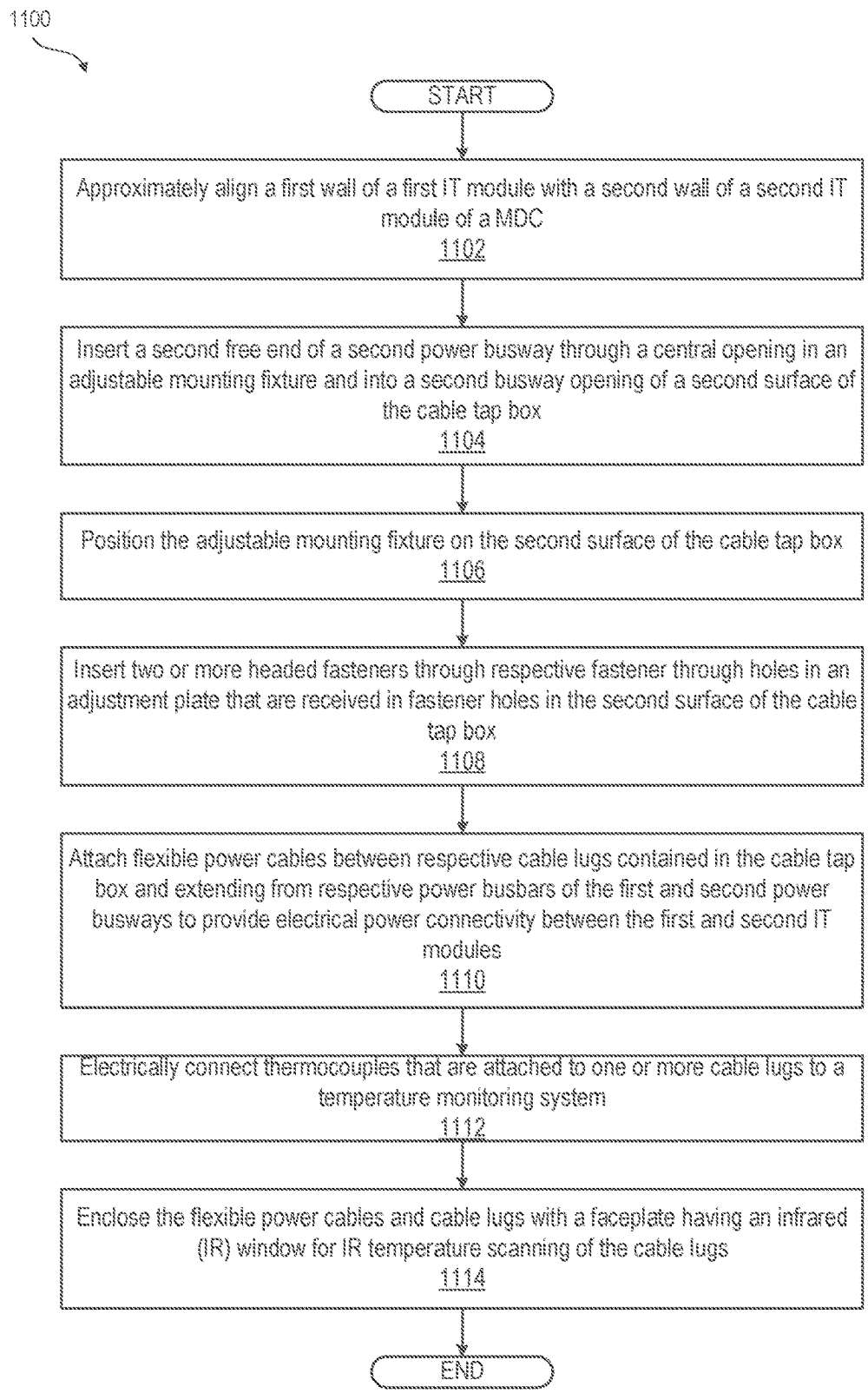
FIG. 11 is a flow diagram of a method 1000 of connecting the power distribution system in adjacent IT modules of a MDC, according to one or more embodiments.

FIG. 11 illustrates a method of connecting the power distribution system in adjacent IT modules of a MDC. Method 1100 begins with approximately aligning a first wall of a first IT module with a second wall of a second IT module of a MDC (block 1102). Method 1100 includes inserting a second free end of a second power busway through a central opening in an adjustable mounting fixture and into a second busway opening of a second surface of the cable tap box (block 1104). The second busway opening is sized larger than the second power busway to receive the second free end of the second power busway with an amount of linear misalignment. Method 1100 includes positioning the adjustable mounting fixture on the second surface of the cable tap box (block 1106). Method 1100 includes inserting two or more headed fasteners through respective fastener through holes in an adjustment plate that are received in fastener holes in the second surface of the cable tap box (block 1108). The fastener through holes are elongated to provide at least one of: (i) horizontal, (ii) vertical and (iii) rotational adjustment between the second surface of the cable tap box and the adjustment plate. Method 1100 includes attaching flexible power cables between respective cable lugs contained in the cable tap box and extending from respective power busbars of the first and second power busways to provide electrical power connectivity between the first and second IT modules (block 1110). Method 1100 includes electrically connecting thermocouples that are attached to one or more cable lugs to a temperature monitoring system (block 1112). Method 1100 includes enclosing the flexible power cables and cable lugs with a faceplate having an infrared (IR) window for IR temperature scanning of the cable lugs (block 1114). Then method 1100 ends.

In the above described flow charts of FIGS. 10-11, one or more of the methods may be embodied in an automated controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A power busway assembly comprising:
   a first power busway comprising one or more first power busbars and attachable to a first wall of a first information technology (IT) module of a modular data center (MDC) and having a first free end;
   a second power busway comprising one or more second power busbars having a second free end and attachable to a second wall of a second IT module that is approximately aligned with the first wall of the first IT module;
   a cable tap box attachable to the first wall of the first IT module and having a first surface including a first busway opening that receives the first free end of the first power busway and having a second surface with a second busway opening being sized larger than the second power busway to receive the second free end of the second power busway with an amount of linear misalignment; and
   an adjustable mounting fixture having a central opening that slidingly engages the second free end of the second power busway and having an outer portion that adjustably attaches to the second surface of the cable tap box to position the second power busway within the second busway opening.

2. The power busway assembly of claim 1, wherein the adjustable mounting fixture comprises: two or more headed fasteners that received in fastener holes in the second surface of the cable tap box; an adjustment plate having more than one fastener through hole that are elongate to provide at least one of: (i) horizontal, (ii) vertical or (iii) rotational adjustment between the second surface of the cable tap box and the adjustment plate.

3. The power busway assembly of claim 1, wherein:
   the first free end of the first power busway comprises a respective first cable lug extending from and electrically connected to each of the one or more first power busbars;
   the second free end of the second power busway comprises a respective second cable lug extending from and electrically connected to each of the one or more second power busbars;
   the cable tap box contains the respective first and second cable lugs opposingly extending from the first and second power busways, the power busway assembly further comprising:
   one or more flexible power cables contained within the cable tap box and attached between the respective first and second cable lugs of the first and second power busways to provide electrical power connectivity between the first and second IT modules.

4. The power busway assembly of claim 3, further comprising: a temperature thermocouple attached respectively to each of the first and second cable lugs for monitoring a temperature of the respective first or second cable lugs; and
   a maintenance monitoring system in communication with each temperature thermocouple to provide a warning in response to at least one of the temperature thermocouple sensing a temperature above a threshold.

5. The power busway assembly of claim 3, wherein the cable tap box comprises an infra-red (IR) scan window that enables IR inspection of the flexible power cables and cable lugs.

6. A modular data center (MDC) comprising:
   a first information technology (IT) module having a first wall;
   a second IT module having a second wall that is approximately aligned with the first wall of the first IT module; and
   a power busway assembly comprising:
   a first power busway comprising one or more first power busbars having a first free end and attached to the first wall of the first IT module;
   a second power busway comprising one or more second power busbars having a second free end and attached to the second wall of the second IT module;
   a cable tap box attached to the first wall of the first IT module and having a first surface including a first busway opening that receives the first free end of the first power busway and having a second surface with a second busway opening being sized larger than the second power busway to receive the second free end of the second power busway with an amount of linear misalignment; and
   an adjustable mounting fixture having a central opening that slidingly engages the second free end of the second power busway and having an outer portion that adjustably attaches to the second surface of the cable tap box to position the second power busway within the second busway opening.

7. The MDC of claim 6, wherein the adjustable mounting fixture comprises: two or more headed fasteners that received in fastener holes in the second surface of the cable tap box; an adjustment plate having more than one fastener through hole that are elongate to provide at least one of: (i) horizontal, (ii) vertical or (iii) rotational adjustment between the second surface of the cable tap box and the adjustment plate.

8. The MDC of claim 6, wherein:
the first free end of the first power busway comprises a respective cable lug extending from and electrically connected to each of the one or more first power busbar;
the second free end of the second power busway comprises a respective cable lug extending from and electrically connected to each of the one or more second power busbar;
the cable tap box contains the respective first and second cable lugs opposingly extending from the first and second power busways, the power busway assembly further comprising:
one or more flexible power cables contained within the cable tap box and attached between the respective first and second cable lugs of the first and second power busways to provide electrical power connectivity between the first and second IT modules.

9. The MDC of claim 8, further comprising:
a temperature thermocouple attached respectively to each of the first and second cable lugs for monitoring a temperature of the respective first or second cable lugs; and
a maintenance monitoring system in communication with each temperature thermocouple to provide a warning in response to at least one of the temperature thermocouple sensing a temperature above a threshold.

10. The MDC of claim 8, wherein the cable tap box comprises an infra-red (IR) scan window that enables IR inspection of the flexible power cables and cable lugs.

11. A method comprising:
substantially aligning a first wall of a first information technology (IT) module with a second wall of a second IT module of a modular data center (MDC), wherein a first power busway comprising one or more first power busbars is attached to the first wall of the first IT module, a first free end of the first power busway is inserted into a first busway opening on a first surface of a cable tap box, and the cable tap box is attached to the first wall of the first IT module;
inserting a second free end of a second power busway that is attached to the second wall of the second IT module through a central opening in an adjustable mounting fixture and into a second busway opening of a second surface of the cable tap box, the second busway opening being sized larger than the second power busway to receive the second free end of the second power busway with an amount of linear misalignment, the second power busway comprising one or more second power busbars attached to the second wall of the second IT module; and
attaching the adjustable mounting fixture to the second surface of the cable tap box to secure the second power busway in the second busway opening.

12. The method of claim 11, wherein attaching the adjustable mounting fixture comprises inserting two or more headed fasteners through respective fastener through holes in an adjustment plate that are received in fastener holes in the second surface of the cable tap box, wherein the fastener through holes are elongate to provide at least one of: (i) horizontal, (ii) vertical or (iii) rotational adjustment between the second surface of the cable tap box and the adjustment plate.

13. The method of claim 11, further comprising attaching flexible power cables between at least one respective pair of cable lugs contained in the cable tap box and extending from a respective one of the one or more first power busbars of the first to a respective one of the one or more second power busbars of the second power busways to provide electrical power connectivity between the first and second IT modules.

14. The method of claim 13, further comprising: monitoring temperature thermocouples attached respectively to each one of the at least one respective pair of cable lugs; and
determining whether any temperature value from the temperature thermocouples is greater than a threshold; and
in response to determining that any temperature value is greater than the threshold, providing a warning.

15. The method of claim 13, further comprising:
detecting an infrared (IR) temperature value through a window of the cable tap box;
determining whether the IR temperature value is greater than a threshold; and
in response to determining that the IR temperature value is greater than the threshold, providing a warning.

* * * * *